United States Patent [19]

Alcott

[11] 3,910,804

[45] Oct. 7, 1975

[54] MANUFACTURING METHOD FOR SELF-ALIGNED MOS TRANSISTOR

[75] Inventor: Graham J. Alcott, Santa Monica, Calif.

[73] Assignee: Ampex Corporation, Redwood, Calif.

[22] Filed: July 2, 1973

[21] Appl. No.: 375,657

[52] U.S. Cl. .................................. 148/188; 148/187
[51] Int. Cl.[2] .................................. H01L 7/44
[58] Field of Search ............... 148/188, 187; 29/571

[56] References Cited

UNITED STATES PATENTS

| | | | |
|---|---|---|---|
| 3,212,162 | 10/1965 | Moore | 148/187 |
| 3,354,008 | 11/1967 | Brixey et al. | 148/187 |
| 3,364,085 | 1/1968 | Dahlberg | 148/187 |
| 3,608,189 | 9/1971 | Gray | 29/571 |
| 3,648,665 | 3/1972 | Kim | 29/571 |
| 3,672,983 | 6/1972 | De Witt et al. | 148/187 |
| 3,681,153 | 8/1972 | Clark et al. | 148/187 |
| 3,698,077 | 10/1972 | Dahlberg | 148/187 |
| 3,761,327 | 9/1973 | Harlow et al. | 148/187 |

OTHER PUBLICATIONS

Carlsen, G, Multiple Diffusion for Int. Circ. Dev's, from Single Diffusion; IBM Tech. Discl. Bul., 1967, pp. 1456–1458.

Warner, J., et al; Integrated Circuits; Motorola, Inc; New York, 1965, pp. 10–12.

*Primary Examiner*—Walter R. Satterfield

[57] ABSTRACT

The method of manufacturing a self-aligned, metal gate n-channel MOS transistor includes the steps of depositing a layer of silicon dioxide on a p-type silicon surface, diffusing phosphorus into the silicon dioxide to a depth of about 1,000 A from the silicon surface in a region coextensive with source, drain and gate regions of the transistor, removing the phosphorus doped portion of the silicon dioxide from a region coextensive with the gate region, diffusing phosphorus contained in the remaining phosphorus doped region of silicon dioxide through the rest of the silicon dioxide layer to form n-type source and drain regions in the silicon surface and metalizing the transistor. The phosphorus is diffused to an easily controlled depth in the layer of silicon dioxide, and because the phosphorus converts the silicon dioxide to a phosphosilicate glass having a faster etch rate than silicon dioxide, it is easy to etch away the glass opposite the gate region without etching appreciably into the 1,000 A of silicon dioxide. The simultaneous definition of adjacent drain, gate and source boundary regions results in a self-aligned metal gate transistor.

7 Claims, 5 Drawing Figures

MANUFACTURING METHOD FOR SELF-ALIGNED MOS TRANSISTOR

BACKGROUND OF THE INVENTION

1. Field of the Invention

This invention relates to MOS transistors and more particularly to a method of manufacturing diffused, self-aligned, metal gate MOS field effect transistors.

2. History of the Prior Art

The desirability of exact alignment of the gate boundary of an MOS transistor with adjacent source and drain boundaries is well recognized. Overlapping of these regions results in undesirably increased capacitive coupling while spacing of these regions results in undesirably high channel resistance and poor switching characteristics. This exact alignment is most easily achieved in a self-aligned transistor process wherein the interrelationship of the steps of the manufacturing process constrain the adjacent boundaries to be substantially coterminous.

One such process is known as the silicon gate process. In this process, polycrystalline silicon is used for fabricating the gate electrode and for defining the gate width. This process is difficult to execute and requires an undesirable tradeoff between source and drain oxide thickness and diffusion depth.

Another self-aligning process requires that the gate first be formed and metalized. The source and drain regions are then implanted with impurity ions using the metal gate as a shield. This process requires two metalization steps as well as relatively expensive ion implanting equipment.

SUMMARY OF THE INVENTION

The method of manufacturing a self-aligned, metal gate MOS transistor in accordance with the invention on a substrate of semiconductor material doped with a first impurity and having a surface includes the steps of fabricating an arrangement of dielectric material adjacent the semiconductor surface having spaced apart relatively thick source and drain regions substantially coextensive with desired source and drain transistor regions respectively which are doped with a second impurity of opposite conductivity type, there being a gate region adjacent the surface which is substantially coextensive with a desired transistor gate region and which at most contains dielectric material free of the second impurity and having a thickness substantially less than the thickness of dielectric material in the source and drain regions; forming a relatively thin layer of a second dielectric material which is substantially impervious to the second impurity atop the existing arrangement of dielectric material; diffusing the second impurity from the source and drain regions of the dielectric material into the surface to form source and drain transistor regions in the semiconductor substrate; removing dielectric from the source and drain regions to enable electrical contact to the substrate; and metalizing the transistor with a desired conductor pattern extending over at least substantially the entire gate region.

The fabricating step includes the steps of forming a first layer of the first dielectric material on the semiconductor surface, diffusing a second impurity of a second conductivity type opposite the first conductivity type part way into the first layer to within about 1,000 A of the semiconductor surface over source, drain and gate regions of the transistor, and removing impurity containing oxide over a gate region. The semiconductor material is preferably boron doped silicon having p-type conductivity in which the majority current carriers are holes and the diffusant of opposite conductivity is preferably phosphorus providing n-type conductivity in which the majority current carriers are electrons. As the silicon dioxide in the first layer becomes doped with phosphorus it is converted to a phosphosilicate glass which etches more rapidly than silicon dioxide. This differential etching rate permits a precisely controlled etching depth as the phosphosilicate glass is removed from opposite the gate region. A silicon dioxide thickness of about 1,000 A is thus easily obtained in the gate region.

BRIEF DESCRIPTION OF THE DRAWINGS

A better understanding of the invention may be had from a consideration of the following detailed description taken in conjunction with the somewhat idealized accompanying drawings, in which.

DETAILED DESCRIPTION

Figure 1:
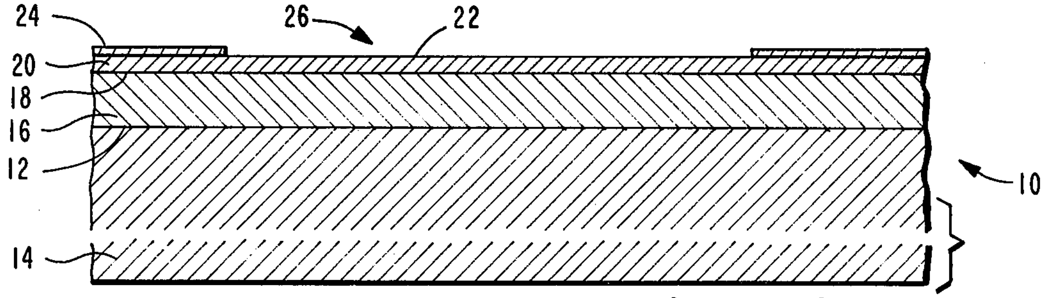
FIG. 1 is a sectional representation of a partly completed transistor in accordance with the invention at an early stage of the manufacturing process.

As shown in FIGS. 1-5, the method of fabricating a transistor 10 in accordance with the invention begins with the preparation of a surface 12 on a boron doped, p-type wafer substrate 14 by cleaning and polishing in a conventional manner. A first layer of approximately 5–10,000 A of silicon dioxide 16 having a surface 18 is deposited on the surface 12 and a second thin masking layer of approximately 100 A of silicon nitride 20 having a surface 22 is deposited on the surface 18. The first, relatively thick layer of silicon dioxide largely determines the total thickness of dielectric over source and drain regions of the transistor 10. This total thickness should be sufficiently great that there is very little capacitive coupling between metal deposited thereon and source or drain transistor regions therebelow.

Photoresist 24 is applied to the surface 22 and selectively removed by a conventional photomasking process to form an aperture in the photoresist 24 defining a transistor region 26 including a source region 28, a gate region 30 and a drain region 32. The second layer of silicon nitride 20 is removed in a hot phosphoric acid etching solution to expose the silicon dioxide surface 18 throughout the transistor region 26 and the photoresist 24 is then removed.

Figure 2:
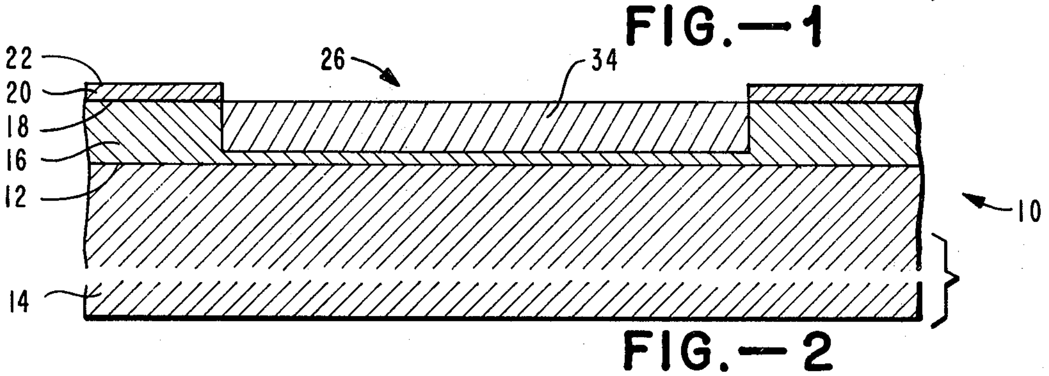
FIG. 2 is a sectional representation illustrating the inventive fabrication process at a later stage than that shown in FIG. 1.

As more particularly illustrated in FIG. 2, the remaining portion of second layer 20 of silicon nitride serves as a mask as a dopant of opposite conductivity type from that of the substrate 14 is diffused into the first layer 16 of silicon dioxide throughout a region of the first layer which is coextensive with the transistor region 26. The doping material is preferably phosphorus which has an n-type conductivity. The phosphorus is diffused part way through the first layer 16 of silicon dioxide to within approximately 1,000 A of the semiconductor surface 12. The phosphorus forms a phosphosilicate glass 34 as it diffuses into the layer 16 of silicon dioxide.

Figure 3:
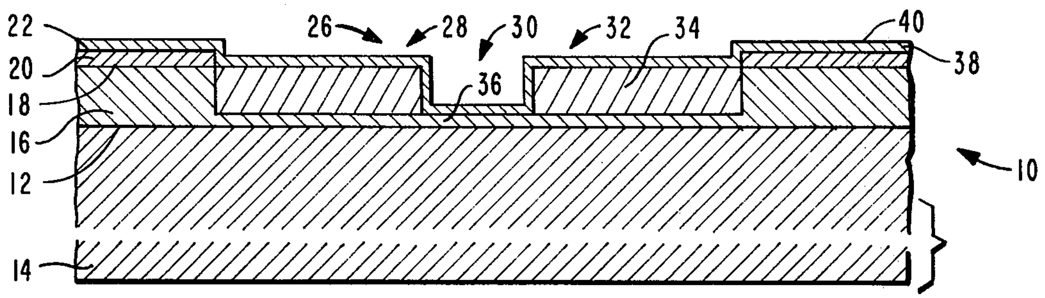
FIG. 3 is a sectional representation illustrating the inventive fabrication process at a later stage than that shown in FIG. 2.

As more particularly illustrated in FIG. 3, the gate region 30 is then defined by a conventional photomasking process and the phosphosilicate glass 34 is removed throughout the gate region 30 by etching the wafer in 20:1 HF. The phosphosilicate glass etches about 20 times faster in this etchant than silicon dioxide. As a result, an etching time of about 40 seconds to 90 seconds for a phosphosilicate glass thickness of about 4–9,000 A respectively permits the phosphosilicate glass to be completely removed without appreciably disturbing the remaining 1,000 A layer 36 of silicon dioxide.

Figure 4:
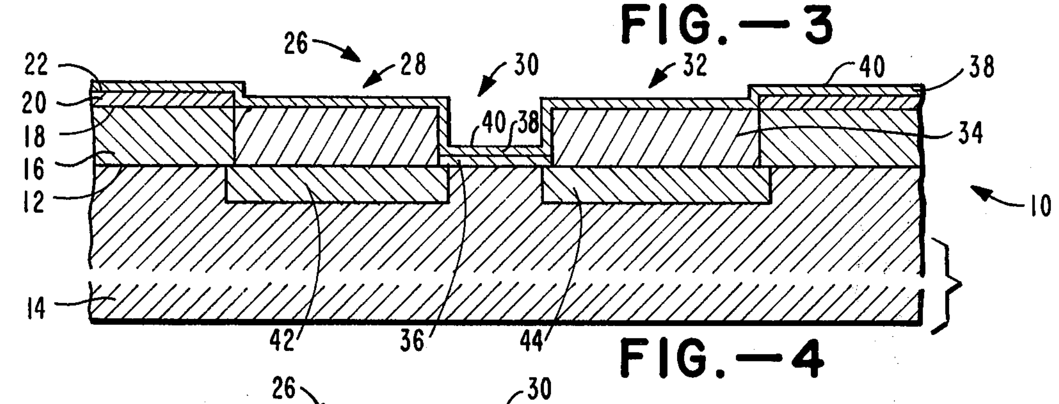
FIG. 4 is a sectional representation illustrating the inventive fabrication process at a later stage than that shown in FIG. 3.

A third layer 38 of silicon nitride having a surface 40 is then deposited on the transistor structure and the phosphorus in the remaining phosphosilicate glass 34 is driven by diffusion on through the first layer 16 of silicon dioxide and into the silicon substrate 14 to form n-type source and drain diffusions 42, 44 as shown in FIG. 4. The nitride layer serves as a mask to prevent phosphorus from out diffusing from the phosphosilicate glass 34 and through the layer 36 of silicon dioxide to the silicon surface 14 within the gate region 30. These n+-type diffusions 42, 44 typically extend into the p-type substrate 14 to a depth of about 1.0 micron. The third layer 38 of silicon nitride has a thickness of about 200 A to increase the gate dielectric to a desired total thickness of about 1200 A. In general, the gain of an MOS transistor is inversely proportional to the total thickness of the gate dielectric. If the gate dielectric thickness is greater than about 5,000 A the transistor will not be sufficiently responsive to an input signal. On the other hand, if the thickness of the gate dielectric is less than 1,000 A the probability of a defect due to gate leakage becomes excessive and the gate dielectric breaks down at an unacceptably low input voltage.

Since the etching of the phosphosilicate glass 34 in the gate region simultaneously defines the boundary of the gate region 30 and the adjoining boundaries of the source and drain regions 28, 32, the transistor 10 automatically becomes self-aligned. A slight receding of the gate region boundary caused by the plating of layer 40 of silicon nitride on the side walls 46 of the phosphosilicate glass 34 adjacent the gate region is compensated for by a slight lateral diffusion as the source and drain regions 42, 44 are formed in the silicon substrate.

Figure 5:
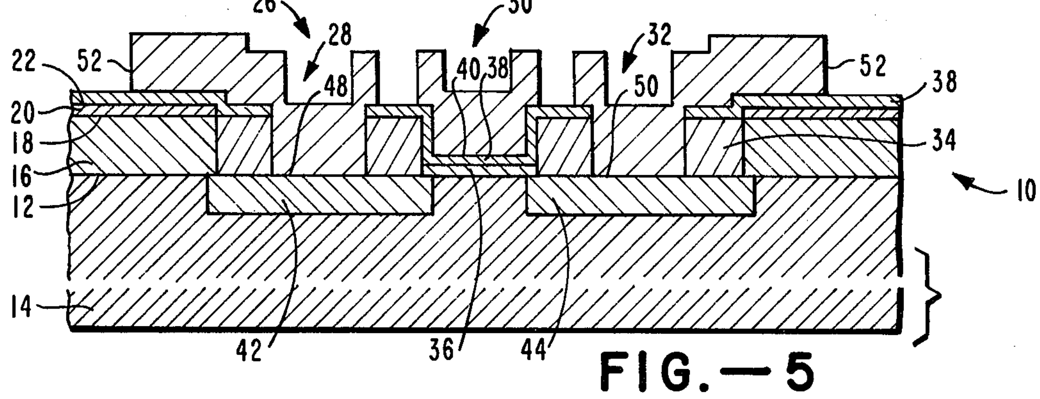
FIG. 5 is a sectional representation illustrating a completed n-channel MOS field effect transistor in accordance with the invention.

The fabrication of the transistor 10 is then completed by metalizing it in a conventional process as illustrated in FIG. 5. Source and drain contacts 48, 50 are formed by etching apertures in the phosphosilicate glass 34 and third layer 38 within the source region 28 and drain region 32. A layer 52 of metal such as aluminum is then deposited on the transistor structure to a typical depth of one to two microns in a conventional sputtering or vapor deposition process and selectively etched to connect the source, drain and gate in a desired conductor pattern which is at least coextensive with substantially the entire gate region.

Although there has been described above a particular method of fabricating a diffused MOS field effect transistor in accordance with the invention for the purpose of illustrating the manner in which the invention may be used to advantage, it will be appreciated that the invention is not limited thereto. Accordingly, any modification, variation or equivalent arrangement within the scope of the appended claims should be considered to be within the scope of the invention.

What is claimed is:

1. The method of fabricating a self-aligned MOS transistor on a substrate of semiconductor material which is doped with a selected first impurity having a first type of conductivity and which has a surface comprising steps of:

depositing a first layer of silicon dioxide on the silicon surface;

depositing a second layer of silicon nitride on the first layer of silicon dioxide;

removing the second layer of silicon nitride from a region coextensive with a transistor region in which the source, gate and drain of the transistor are to be formed;

diffusing phosphorus part way into the first layer in the transistor region to form a phosphosilicate glass extending from the surface of the first layer almost to the surface of the semiconductor material, the distance of the phosphosilicate glass from the silicon surface being dependent upon a desired gate dielectric thickness and being less than 5,000 Angstroms;

removing the phosphosilicate glass which is opposite a desired gate region of the transistor between desired source and drain regions;

forming a third, relatively thin layer of silicon nitride atop the existing arrangement of dielectric material to make the total thickness of dielectric opposite the gate region at least 1,000 Angstroms and not more than 5,000 Angstroms.

2. The method of fabricating a self-aligned MOS transistor as set forth in claim 1 above, further comprising the steps of removing dielectric from a portion of the source and drain regions to enable electrical contact to the source and drain transistor regions in the semiconductor substrate and metalizing the transistor with a desired conductor pattern extending over at least substantially the entire gate region.

3. The method of fabricating a self-aligned MOS transistor on a surface of semiconductor material of selected conductivity type comprising the steps of:

depositing a first layer of dielectric material on the semiconductor surface;

diffusing a selected impurity of a type opposite the selected semiconductor conductivity type part way into a region of the first layer opposite a desired location for the transistor, said opposite conductivity type impurity being diffused to within a distance of the semiconductor surface which is no greater than a desired gate dielectric thickness;

removing all of the opposite conductivity type impurity doped portion of the first layer which is opposite a desired gate region for the transistor;

diffusing the remaining opposite conductivity type impurities through the portion of the first layer opposite thereto and into the opposing portion of the semiconductor surface to a depth sufficient to form source and drain transistor regions of the material; and metalizing the transistor.

4. The method of fabricating set forth in claim 3 above, wherein the step of removing includes the steps of defining a gate region with a photomasking process and etching the impurity doped portion of the first layer with an etchant that etches the impurity doped portion of the first layer dielectric material faster than the undoped portion of the first layer dielectric material.

5. The method of fabricating a self-aligned n-channel MOS transistor on a surface of boron doped silicon semiconductor material comprising the steps of:

depositing a first layer of silicon dioxide on the surface of the semiconductor to a depth greater than a desired gate dielectric thickness;

depositing a second layer of silicon nitride on the first layer of silicon dioxide;

removing the second layer of silicon nitride from a region coextensive with a transistor region in which the source, gate and drain of the transistor are to be formed;

diffusing phosphorus part way into the first layer in the transistor region to form a phosphosilicate glass extending from the surface of the first layer almost to the surface of the semiconductor material with the distance between the semiconductor surface and the phosphosilicate glass being no greater than a desired gate dielectric thickness;

removing the phosphosilicate glass from a gate region within the transistor region;

depositing a third layer of silicon nitride on the structure resulting from the preceding steps;

diffusing phosphorus ions in the remaining phosphosilicate glass portion of the first layer through the remaining opposing portion of the second layer and into an opposing region of the semiconductor material to form spaced apart n-type source and drain transistor regions in the semiconductor material;

removing portions of the first and third layers opposite the source and drain regions;

depositing metal on the surface of the transistor structure; and selectively removing deposited metal to form a desired conductor pattern contacting the source, drain and gate regions of the transistor.

6. The method of fabricating a self-aligned MOS transistor in a substrate of semiconductor material which is doped with a selected first impurity having a first type of conductivity and which has a surface comprising the steps of:

fabricating an arrangement of dielectric material adjacent the semiconductor surface having spaced apart source and drain regions of dielectric material substantially coextensive with desired transistor source and drain regions respectively in the substrate, at least a portion of the dielectric material of the source and drain regions being doped with a second impurity of a second conductivity type opposite that of the first conductivity type, and having a gate region of dielectric material adjacent the semiconductor surface which is at least 3,800 Angstroms thinner than the source and drain regions of dielectric material and which is undoped with respect to the second impurity, the gate region being substantially coextensive with a desired transistor gate region in the substrate;

diffusing the second impurity from the source and drain regions of the dielectric material into the semiconductor surface to form source and drain transistor regions of the second conductivity type in the semiconductor substrate; and forming conductive paths connecting the source, drain and gate regions in a desired circuit pattern.

7. The method of fabricating a self-aligned MOS transistor in a substrate of semiconductor material which is doped with a selected first impurity having a first type of conductivity and which has a surface comprising the steps of:

fabricating an arrangement of dielectric material adjacent the semiconductor surface having spaced apart source and drain regions of at least 5,000 Angstroms thick dielectric material substantially coextensive with desired transistor source and drain regions respectively in the substrate, at least a portion of the dielectric material of the source and drain regions being doped with a second impurity of a second conductivity type opposite that of the first conductivity type, and having a gate region of dielectric material adjacent the semiconductor surface which has a thickness between 1,000 and 5,000 Angstroms and which is undoped with respect to the second impurity, the gate region being substantially coextensive with a desired transistor gate region in the substrate;

diffusing the second impurity from the source and drain regions of the dielectric material into the surface to form source and drain transistor regions of the second conductivity type in the semiconductor substrate; and forming conductive paths connecting the source, drain and gate regions in a desired circuit pattern.

* * * * *